United States Patent
Hartranft et al.

(10) Patent No.: US 7,184,253 B1
(45) Date of Patent: Feb. 27, 2007

(54) ESD TRIGGER CIRCUIT WITH INJECTED CURRENT COMPENSATION

(75) Inventors: Marc Hartranft, Scotts Valley, CA (US); Eric Mann, Sammamish, WA (US); Dan Zupcau, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/332,676

(22) Filed: Jan. 13, 2006

(51) Int. Cl.
*H02H 3/22* (2006.01)
(52) U.S. Cl. ......................................... 361/111; 361/56
(58) Field of Classification Search ................ 361/111, 361/56
See application file for complete search history.

(56) References Cited

U.S. PATENT DOCUMENTS

| | | | | |
|---|---|---|---|---|
| 6,104,588 A | * | 8/2000 | Hariton et al. | ............... 361/111 |
| 6,248,616 B1 | * | 6/2001 | Ravanelli et al. | ............ 438/138 |
| 6,522,511 B1 | * | 2/2003 | John et al. | ...................... 361/56 |
| 6,611,154 B2 | * | 8/2003 | Grasso et al. | .................. 326/83 |
| 6,710,990 B2 | * | 3/2004 | Walker et al. | ................. 361/56 |
| 6,809,954 B1 | * | 10/2004 | Madan et al. | ............... 365/145 |
| 2005/0275453 A1 | * | 12/2005 | Douts et al. | .................... 330/9 |

* cited by examiner

*Primary Examiner*—Stephen W. Jackson
*Assistant Examiner*—Ann T Hoang
(74) *Attorney, Agent, or Firm*—Bradley T. Sako

(57) ABSTRACT

A circuit (100) can include a first section (102) that can provide a designated function within an integrated circuit device that can be altered due to current injection at a node (106). A mirror section (104) can mirror the effects of current injection on one or more devices within first section (102) and generate an output indication INJ_EFF representing such effects. In one very particular arrangement, detection of an injected current can be used to prevent false triggering of a switched electrostatic discharge (ESD) current path.

20 Claims, 5 Drawing Sheets

ESD TRIGGER CIRCUIT WITH INJECTED CURRENT COMPENSATION

TECHNICAL FIELD

The present invention relates generally to integrated circuit devices, and more particularly to circuits that can compensate for unwanted changes in device performance due to current injection into a substrate, and like effects.

BACKGROUND OF THE INVENTION

Integrated circuit devices typically include a number of circuit elements, including active elements, such as transistors, and sometimes passive elements, such as resistors and capacitors formed in an integrated circuit substrate. In operation, an integrated circuit substrate can be subject to unplanned current injection events that can adversely affect the operation of the circuits.

For example, the potential of external signal paths connected to integrated circuits pins may briefly drop below an ideal low supply voltage. Integrated circuit pins may also be referred to as pads. This brief drop, sometimes called undershoot, may cause the interface signal to drop below the ideal low voltage supply. Undershoot can be caused by a number of factors, including mismatch between signal generator output impedance and signal receiver input impedance, transmission line mismatch, wiring inductance, power supply noise, and other causes.

In the case of an undershoot condition, current (in this case electrons) can be injected into the substrate of an integrated circuit. This injection can occur when reverse biased p-n junctions which normally isolate the substrate from external signals become forward biased due to the undershoot. The p-n junctions form diodes which conduct current in the forward biased condition and block current in the reverse biased condition. The p-n junctions connected to external signal interfaces in integrated circuits may be explicit diodes or inherent diodes formed from the junctions of other semiconductor devices. An example of a semiconductor device with inherent or parasitic diodes are field effect transistors (FETs) which typically use reverse bias to isolate the source and drain semiconductor materials from the substrate (also called body or bulk) semiconductor material.

The source and drain materials are usually the complement of the body or bulk, that is for an n-channel MOSFET, the body or bulk are typically p-type semiconductor material and the source and drain regions are formed with n-type semiconductor material. Regions of semiconductor material of the opposite doping of the surrounding material can be called a diffusion region(s) or simply diffusion. The source and drain regions of a FET may be called source or drain diffusion or source drain junctions. The term diffusion can mean any means of introducing impurities (doping) into silicon to obtain n-type or p-type material, including but not limited to diffusion and ion-implantation. Junction can refer to the p-n interface of a semiconductor, but is also commonly used to refer to source or drain regions of MOSFET devices.

The current injected into the substrate may disturb the normal operation of a semiconductor device. In particular, circuit nodes that are not strongly maintained at desired potentials can have their potential affected by the substrate currents. More particularly, the substrate current can cause undesired current to flow in nearby reverse biased p-n junctions. These undesired currents can affect the potential of nodes which are not strongly driven to the desired potential. High impedance nodes such as those using high resistance pull-up or pull-down resistors are examples of nodes which are not strongly driven to the desired potential. The undesired current can change the desired voltage of the high-resistance node. In the case of a node with a high value resistor, the error voltage may be the resistor value in ohms multiplied by the undesired current.

A very particular example of unwanted current injection effects, as related to an electrostatic discharge (ESD) protection circuit, will now be described.

Typically, integrated circuit devices (i.e., chips) have interface pads which connect to external signals and that include protection against ESD events. An ESD event can include the transfer of a significant amount of electrical energy to an integrated circuit interface pad in a very short time (usually tens to hundreds of nanoseconds). The integrated circuit must be capable of dissipating the energy from the ESD event to prevent damage to devices contained in the integrated circuit. ESD protection systems are usually implemented on integrated circuits to provide ESD protection. More specifically, the integrated circuit must be able to conduct the current from the ESD event while limiting the potential on the integrated circuit to values that do not cause damage. The integrated circuit must also be able to dissipate both the peak power and energy of the ESD event. The respective external interface pad subject to the ESD event can be referred to as the "zapped" pad.

Various conventional approaches to ESD protection are known. One method can be to use "snapback" devices. Such an approach can rely on bipolar devices including junction transistors (BJTs) and thyristors which are inherent in most semiconductor integrated circuits and are formed from p-n junctions. These bipolar devices can include those devices normally considered to be parasitic devices in technologies that use field effect transistors such as complementary metal-oxide-semiconductor (CMOS) based integrated circuits. During an ESD event, the bipolar device can enter a conductive state, to thereby safely dissipate the ESD discharge. A drawback to such a conventional approach can be that parasitic bipolar devices can be difficult to control in actual implementation. The difficulty in controlling electrical parameters of these devices and the difficulty of modeling their behavior to allow simulating ESD protection networks makes it difficult to predict the ESD protection provided by these networks. The lack of predictability can lead to inferior ESD performance, or over designed networks which are large, or both. In addition, such approaches can consume relatively large amounts of silicon area.

A second conventional approach to ESD protection can be an actively switched network. A control circuit is used to activate the turn on of devices to conduct the ESD current through an actively switched network. The control circuit should be capable of differentiating between normal operation and an ESD event. The control circuit which detects the ESD event is commonly called a trigger circuit. As compared to a conventional method using snapback devices, this switched ESD network method can be simulated using conventional circuit simulators, resulting in more predictable protection from ESD discharges.

A conventional trigger circuit may contain nodes not strongly driven to the desired potential. These nodes exist to control generation and timing of the signals which activate the switched ESD network. In normal operation, these nodes are expected to remain at the desired potential to prevent "false triggering" or activation of the ESD network during normal device operation. The substrate current previously described can be present in the area of the ESD trigger circuit, and can cause "false triggering" in conventional trigger circuits during normal device operation.

Activating the ESD network under normal operating conditions results in excessive power consumption, may cause the integrated circuit to fail to operate as intended, and may cause permanent damage to the integrated circuit.

Referring now to FIG. 5, a conventional actively switched ESD protection network is shown in a block schematic diagram and designated by the general reference character 500. For simplicity of description, conventional network 500 shows protection for a single interface pad.

FIG. 5 shows an interface pad 502 which may experience an ESD discharge (an ESD event). The interface pad 502 may be connected to ESD protection diodes D1 and D2. These diodes may be explicit or parasitic diodes formed by the drain junctions of MOSFET transistors. Such diodes can ensure that a current path during an ESD event conducts current away from interface pad circuitry that is to be protected. A conventional network 500 can also include a high voltage power supply bus 504, as well as a low voltage power supply bus 506.

Conventional ESD network 500 further includes trigger circuit 508 with corresponding current switch 510. Trigger circuit 508 can act as an ESD event detector that generates a pulse "trig_out" of a predetermined width at the output 512 in an ESD type event. More particularly, if a slew rate at high voltage power supply bus 504 (and implicitly the slew rate of a respective zapped pad) exceeds a certain value, the event can be considered an actionable ESD event and a pulse can be output by the trigger circuit 508 detecting the event.

Accordingly, in FIG. 5, trigger output signal trig_out can control one or more current switches 510 connected between a high voltage power supply node (e.g., pad) 504 and a low voltage power supply node (e.g., pad) 506. The current switch 510 can also be called a shunt or a clamp. In metal oxide semiconductor technologies, it is often implemented as an insulated-gate field effect transistor.

A basic operation of conventional network 500 during a typical ESD event will now be described. In the example described, it is assumed that a zapped pad is 502, with the ESD energy being applied with respect to the low voltage power supply, now referred to as ground.

In such an event, an ESD event can occur at an interface pad 502. An ESD discharge resulting from the event is transferred from the zapped pad 502 to high voltage power (Vcc) supply bus 504 via diode D1, causing the Vcc potential at bus 504 to rise quickly.

Provided the ESD event causes a sufficiently high slew rate on Vcc bus 504, one or more trigger circuits 508, powered by the Vcc bus 504, can detect the ESD event and turn on corresponding current switch 510 connected directly across supply buses 504 and 506. Such an enabled current switch 510 can serve as an ESD clamp and route ESD current from high voltage power supply bus 504 to low voltage power supply bus 506, and thus away from sensitive circuits.

By routing ESD current from high voltage power supply bus 504 to low voltage power supply bus 506 the enabled current switch 510 clamps or limits the voltage between power supply busses 504 and 506. The clamped voltage between power supply busses 504 and 506 is the enabled resistance of the ESD current switch 510 multiplied by the ESD current passing through switch 510 and any supply bus voltage drop. Such a clamping action can also limit on-chip voltages during ESD events. This clamping limits the voltage at the interface pad to prevent damage to circuitry connected to the interface pad (typically inputs, outputs, or both), and also protects other internal circuits of the integrated circuit by limiting internal voltages.

While a trigger circuit 508 is expected to operate in response to a high slew rate (e.g., ESD) event, ideally, such circuits should not trigger during normal functional mode. If such circuits are activated during a normal mode of operation, supply noise can be created, which can adversely affect the performance of the integrated circuit. As but two examples, in the case of a memory device, such supply noise can affect data access times, and in the case of a communication device, create output jitter. Furthermore, excessive power supply current would be required to operate the device as extra current would flow through the ESD switches from the high voltage to the low voltage supply busses. Still further, such a large amount of current can result in permanent device damage.

Unfortunately, some conventional trigger circuits can be susceptible to triggering in a functional mode due to unplanned current injection. One example of such a conventional trigger circuit is shown in a schematic diagram in FIG. 6, and designated by the general reference character 600. A conventional trigger circuit 600 can include a slew rate detector 602, a pulse generator 604, and an output driver 606. A slew rate detector 602 can be an RC differentiator that includes a capacitor C60 and resistor R60 connected in series between an ESD bus 608 and a low power supply bus 610. If an ESD event is translated to ESD bus 608, a slew rate detector 602 can output a signal Vtrip that can have a voltage approximately proportional to an ESD bus 608 voltage (Vtrig) slew rate and the RC time constant of the RC differentiator, as expressed below:

$$Vtrip = R*C*d(Vtrig)/dt$$

where R is the resistance of R60 and C is the capacitance of C60.

A pulse generator 604 can include a voltage level detector implemented with an n-channel metal-oxide-semiconductor (MOS) transistor M60 and a pulse extender implemented with a parallel RC circuit formed by resistor R62 and capacitor C62. According to such a structure, an RC time constant of slew rate detector can be adjusted. Accordingly, during an ESD event the following can hold:

$$R*C*d(Vtrig)/dt >= Vth \text{ (of M60)}.$$

In such a case, transistor M60 can be turned on, and by operation of pulse extender R62,C62, a voltage can be generated between a sense node 612 and ESD bus 608.

During an event determined not to be an actionable ESD event, the following can hold:

$$R*C*d(Vtrig)/dt < Vth \text{ (of M60)}.$$

In such a case, transistor M60 does not become active. Thus, no M60 drain current can be generated and a potential between sense node 612 and ESD bus 608 can remain at zero.

An output driver 606 can process an output of pulse generator 604 to generate a pulse signal trig_out that can activate shunting current source, or the like. In the conventional trigger circuit 600, if the magnitude of V(Vtrig, Vsense)>Vth (M62), a pulse can be generated at an output node 614, where V(Vtrig, Vsense) is the amount by which a potential at sense node 612 is less than that at ESD bus 608.

Ideally, only during an ESD event will a pulse be generated at output node 614.

However, the conventional trigger circuit 600 of FIG. 6 can exhibit false triggering due to injected substrate electrons. Such false triggering can be caused by a parasitic npn BJT 616. Such a BJT 616 can include one or more collectors including at least one formed by a drain diffusion of transistor M60, a base formed by a substrate of the integrated circuit that contains the bulk or body of transistor M60, and one or more emitters connected to semiconductor region into which electrons are injected. In the case of an npn transistor, such an emitter may be formed by n-type semiconductor material connected to interface pads, including diodes or MOSFET source or drain regions, which is surrounded by p-type semiconductor material. Parasitic BJT 616 may have one or more collectors formed by multiple diffusion junctions at various distances from the emitter. These collectors may affect more than one device or circuit.

More than one parasitic BJT 616 may be present. In general each region of n-type semiconductor material may act as an emitter if forward biased with respect to the surrounding p-type material, and each region of n-type semiconductor material reverse biased may act as a collector. While emitters connected to signals from external sources (that is, those emitters connected to interface pads) are more likely to be forward biased than signals generated within the integrated circuit, occasionally internally generated signals may also forward bias emitters.

A false triggering can occur in the absence of any ESD event when injected electrons result in a collector current ($I_C$) of parasitic BJT 616 being large enough to meet the following condition:

$$I_C > = |Vth(M62)|/R62.$$

Under such conditions, a voltage differential between ESD node 608 and node 612 can be large enough to turn on transistor M62, thus generating an active signal trig_out at output node 614. This can activate ESD current switches resulting in the integrated circuit drawing a large operating current (Icc).

The above false triggering can occur during normal operation of a conventional integrated circuit device. In particular, a conventional ESD trigger circuit, like that described above, can be included in an integrated circuit (IC). When such an IC is operating normally, unrelated to ESD events, the trigger circuit can trigger, turning on the ESD current switch and causing the integrated circuit to draw large amounts of current. More particularly, an external signal applied to an interface pad of the integrated circuit may cause a current to be injected into the substrate. This current may cause unintended currents within the trigger circuit, which activate the trigger and result in an undesirable "false trigger".

Due to the potential for false triggering, conventional circuits may require large separation between sensitive circuits and junctions directly connected to interface pads. Such a situation is shown in FIG. 7. FIG. 7 is a top plan view of a portion of an integrated circuit 700 that shows a number of pads (one of which is shown as 702) each of which can include an area in which ESD protection circuits (one such area is shown as 704). Some circuits can be adversely affected by injection current. Accordingly, a circuit sensitive to injected substrate current (706), such as a trigger circuit, may require a minimum distance dmin from injection areas (704). The above assumes that the sensitive circuit 706 is located in close proximity to semiconductor junction that receives injected current. The restricted placement of the sensitive circuit with respect to junctions directly connected to interface can cause inefficient integrated circuit layout and larger, more expensive integrated circuits.

As but one example, a value dmin of greater than 200 microns may be required. The value dmin will depend on many factors including the efficiency of the injecting junction, the efficiency of guard rings and other substrate current collections mechanisms, the number, area and distance of unrelated current collecting junctions, and the sensitivity of the high-impedance node to injected current. Dmin is typically difficult to predict analytically and is usually found through trial and error.

FIG. 8 shows a side cross sectional view of a parasitic transistor formation. FIG. 8 shows how parasitic BJT 816 can be formed in a substrate 800 by one or more portions of n-channel MOSFET M60 and a diffusion region 802 connected to an interface pad 818 for injecting current.

In light of the above, it would be desirable to arrive at some way of addressing changes in transistor performance resulting from substrate current injection events.

It would also be desirable to arrive at an ESD trigger circuit that is not as susceptible to false triggering due to current injection as a conventional approach, like that of FIG. 6.

SUMMARY OF THE INVENTION

According to one embodiment of the invention, a circuit can include pulse generator circuit that receives a trip input signal activated in response to an interface connection voltage transition exceeding a predetermined rate. The pulse generator circuit can include at least a first transistor providing a low impedance path in response to an active trip input signal and a parasitic device formed from at least a portion of the first transistor and an injection diffusion region. An output driver circuit can enable a switched current path in response to an active trip signal when enabled and does not enable the switched current path when disabled. A suppression circuit can include a mirror transistor having the same general structure as the first transistor and a mirror parasitic device formed from at least a portion of the mirror transistor and the injection diffusion region. The suppression circuit can disable the output driver circuit in response to an injection current at the injection diffusion region.

According to another embodiment, a method for compensating for current injection into a substrate of an integrated circuit can include activating an electrostatic discharge (ESD) switched current path in response to a predetermined voltage transition rate at an interface connection to the integrated circuit. Such activation can be by operation of a first transistor having a source-drain path coupled between a high impedance node and a first power supply node. An effective source-drain impedance of the first transistor can be alterable in response to current injection at a substrate region enabling a parasitic transistor. Changes in the operation of the first transistor can be mirrored with a mirror transistor of the same general construction as the first transistor. An effective source-drain impedance of the mirror transistor can be alterable in response to current injection at the substrate region enabling a mirror parasitic transistor. Activation of an ESD switched current path can be prevented in response to current injection induced variation in the effective source-drain impedance of the mirror transistor.

According to another embodiment, a circuit can compensate for current injection in a substrate of an integrated circuit. The circuit can include a first active circuit element that provides a controllable impedance path between a first node and a second node and forms part of a parasitic a current path that is enabled in response to an injection of current at a current injection node. A mirror active circuit element can be formed with the same process steps as the first active circuit element, and can provide a controllable impedance path between a mirror node and the second node. The mirror active circuit element can form part of a mirror parasitic current path that is enabled in response to the injection of current at the current injection node. A detect circuit can be coupled to the mirror circuit element and output an injection effect signal in response to the injection of current at the current injection node.

DETAILED DESCRIPTION

Various embodiments of the present invention will now be described in detail with reference to a number of drawings. The embodiments show circuits and methods for compensating for substrate current injection effects on integrated circuit device operation.

Figure 1:
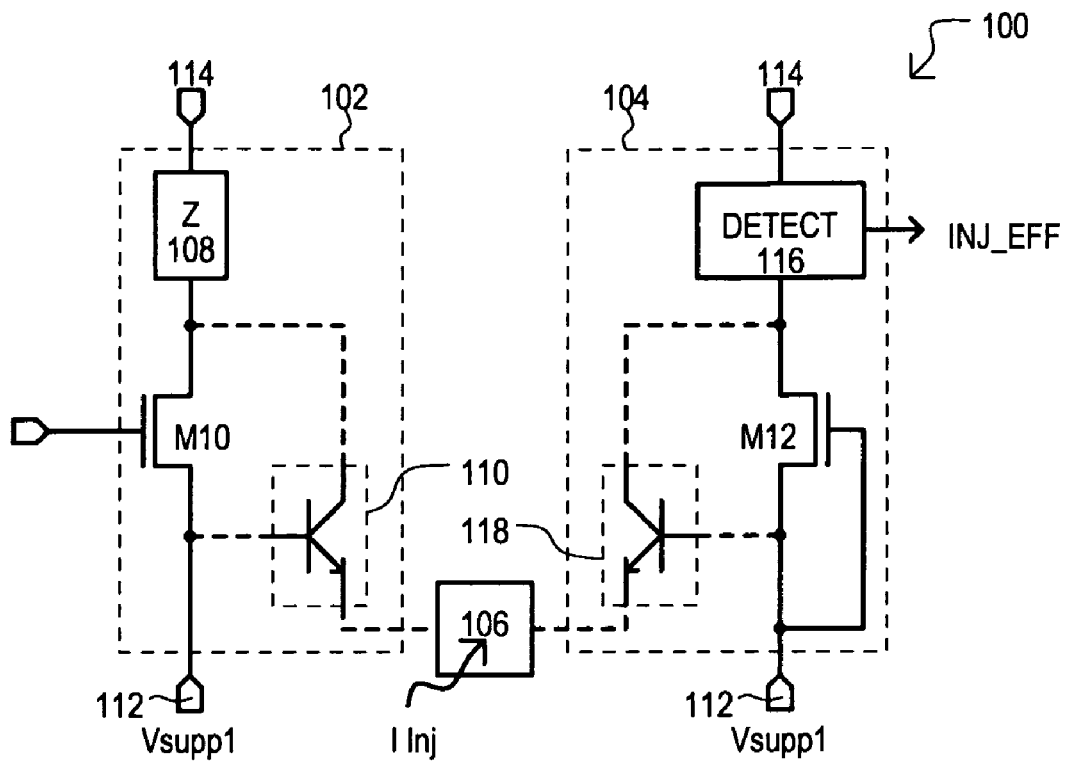
FIG. 1 is a diagram of a circuit according to a first embodiment.

A circuit according to a first embodiment is shown in FIG. 1 and designated by the general reference character 100. A circuit 100 can include a first section 102 and a mirror section 104. A first section 102 can provide a designated function within an integrated circuit device that can be altered due to current injection at a node 106. A mirror section 104 can mirror the effects of current injection on one or more devices within first section 102, and generate an output indication INJ_EFF representing such effects.

A node 106 can be a diffusion region within a substrate of an integrated circuit device that may receive an injection of current. As but two possible examples, such a node can be connected to an interface pad that may be subject to an undershoot condition or an interface pad that intentionally injects current.

In the very particular example of FIG. 1, a first section 102 can include an insulated gate field effect transistor (IGFET) (hereinafter referred to a MOS transistor but not intended to imply any particular gate dielectric composition) M10, and an impedance 108. In addition, a first section 102 can include a parasitic bipolar junction transistor (BJT) 110. Transistor M10 can have a drain connected to a node 114 by impedance 108 and a source connected to a power supply node 112. Parasitic transistor 110 can have a collector formed by a drain of transistor M10, a base formed by a substrate that includes the channel of transistor M10, and an emitter connected to a node 106.

When little or no current is injected at node 106, a first section 102 can operate with transistor M10 providing a controllable impedance path between impedance 108 and node 112 based upon a gate-to-source voltage ($V_{GS}$) and drain-source voltage ($V_{DS}$) (i.e., "normal" biasing conditions). However, if sufficient current is injected at node 106, parasitic transistor 110 can draw a current that can alter the effective impedance presented by transistor M10 (i.e., more effective current drawn through impedance 108).

In the very particular example of FIG. 1, a mirror section 104 can include a mirror MOS transistor M12 and a detect circuit 116. Transistor M12 can be a "scaled" version of transistor M10. That is, transistor M12 can be manufactured according to the same steps as transistor M10. Further, if transistor M10 has width-to-length dimensions of (W/L), transistor M12 can have the same W/L ratio, but may also be larger (or smaller). That is, if transistor M10 has a channel width of W and length of L, the channel dimensions transistor M12 can be m*W and n*L, where m and n are positive numbers. In addition, transistor M12 can be situated so as to form a mirror parasitic BJT 118. In such an arrangement, mirror parasitic BJT 118 can be likewise be scaled with respect to parasitic BJT 110 by scaling the emitter area which corresponds to the diffusion areas of M10 and M12 respectively.

A transistor M12 can have a drain connected to a node 114 by detect circuit 116 and a source and gate connected to power supply node 112. Due to the mirroring arrangement with respect to transistor M10, parasitic transistor 118 can have a collector formed by a drain of transistor M12, a base formed by a substrate that includes at least a portion the channel of transistor M12, and an emitter also connected to node 106.

Following the above statements, a drain current through parasitic BJT 110 during current injection at interface pad 106 can be replicated and scaled (either identical or multiplied by a positive number) as a current from the drain terminal of M12 through BJT 118.

In such an arrangement, the operation of parasitic transistor 118 can mirror that of parasitic transistor 110. Consequently, changes in the performance of transistor M10 due to a parasitic current of transistor 110 can be reflected by changes in the performance of transistor M12. More particularly, as the effective impedance of transistor M12 (i.e., current draw at drain node of M12) is altered by parasitic transistor 118, a drain potential and/or current can vary. This variance can be detected by detect circuit 116, which can generate effect signal INJ_EFF.

It is noted that in particular arrangements, transistors M10 and M12 can be n-channel MOS devices, parasitic transistors 110 and 118 can be npn BJTs, and power supply node 112 can be a low power supply node.

In yet other embodiments, replicating parasitic currents caused by injected substrate current can be used to disable trigger circuits in actively switched electrostatic discharge (ESD) protection network, to thus prevent ESD clamping devices from being enabled during normal operation. As but one very particular example, trigger devices can be disabled when interface pads inject currents into the substrate. One such arrangement is shown in a second embodiment in FIG. 2.

Figure 2:
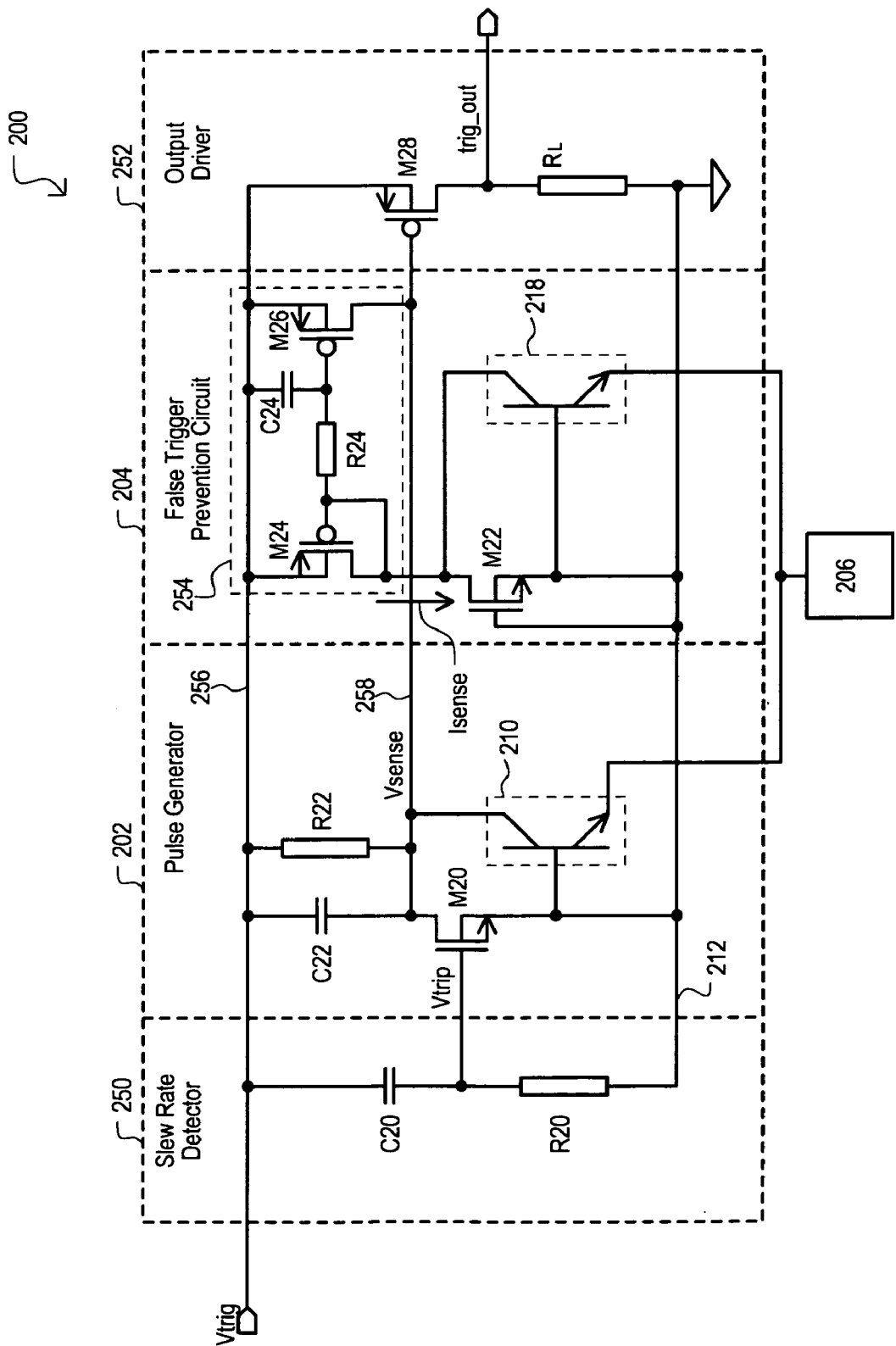
FIG. 2 is a schematic diagram of an electrostatic discharge (ESD) trigger circuit according to a second embodiment.

A circuit according to a second embodiment is shown in FIG. 2 and designated by the general reference character 200. A circuit 200 can be a trigger circuit in an actively switched ESD protection network, like that shown in FIG. 5. Circuit 200 can include some of the same general circuit components/sections as FIG. 1. Accordingly, like sections are referred to by the same reference character but with the first digit being a "2" instead of a "1". Further, transistors M20 and M22 are shown as n-channel MOS transistors, and parasitic devices (210 and 218) are shown as npn BJTs.

Figure 6:
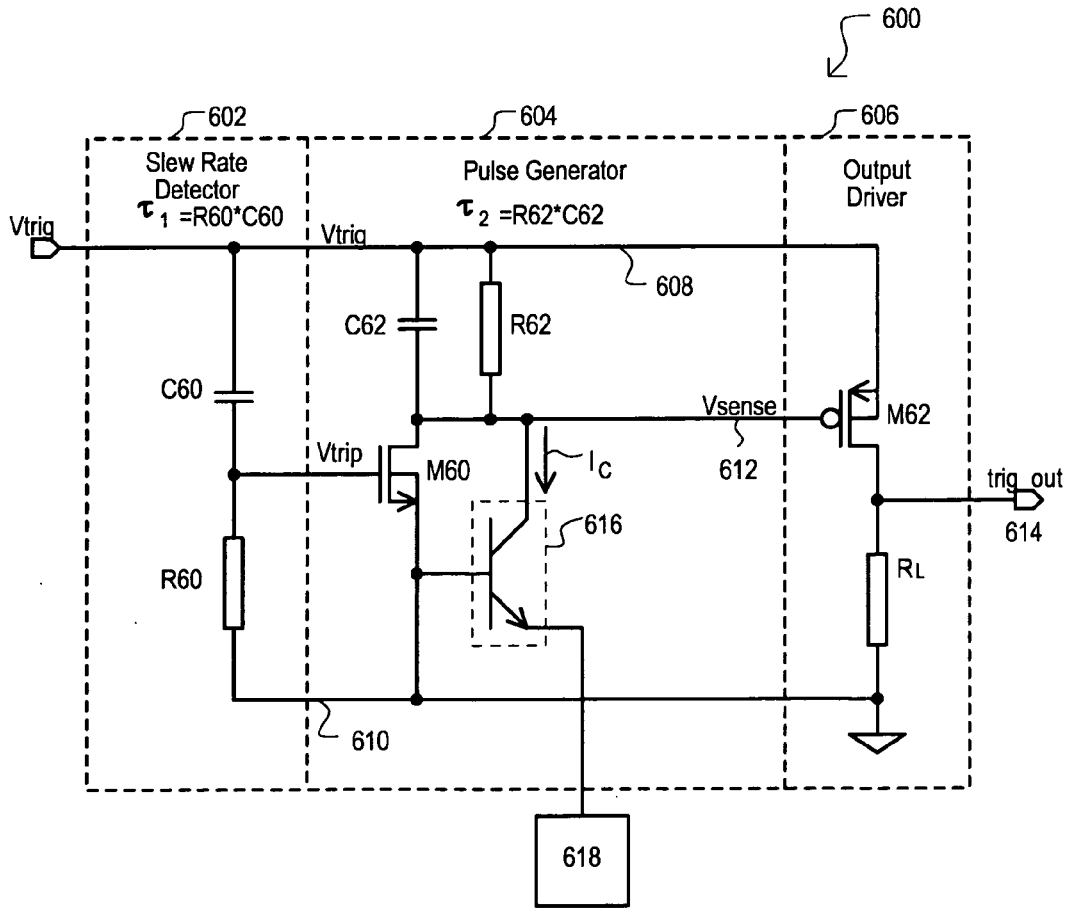
FIG. 6 is a schematic diagram of a conventional ESD trigger circuit.

A circuit 200 can include a first section 202, a mirror section 204, a slew rate detector 250 and an output driver 252. In FIG. 2, a first section 202 can be a pulse generator, like that shown as 604 FIG. 6, and can operate in the same general fashion. Similarly, a slew rate detector 250 and output driver 252 can operate in the same general fashion as 602 and 606, respectively, of FIG. 6.

A mirror section 204 can be a trigger prevention circuit that can disable output driver 252 in response to current being injected at node 206. Mirror section 204 can include mirror transistor M22, parasitic npn BJT 218, and filtered current mirror 254. Transistor M22 can be a scaled version of transistor M20. As a result, parasitic BJT 218 can be likewise scaled with respect to parasitic BJT 210 and provide a correspondingly scaled injected current at a drain of transistor M22.

Filtered current mirror 254 can include p-channel MOS (PMOS) transistors M24 and M26, and a low pass filter formed by resistor R24 and capacitor C24. PMOS transistor M24 can have a source connected to an ESD bus 256 and a gate and drain connected to a drain of mirror transistor M22. PMOS transistor M26 can have a source connected to ESD bus 256, a gate connected to the gate of PMOS transistor M24 by resistor R24, and a drain connected to a sense node 258. Capacitor C24 can be connected between ESD node 256 and a gate of PMOS transistor M26.

In the arrangement of FIG. 2, current injection can occur at node 206, causing a potential Vsense at sense node 258 to drop in potential. However, at the same time, injected current affecting the potential at the drain of transistor M22 can be mirrored through filtered current mirror M24/M26. Thus, transistor M26 can play the role of a false trigger clamp. In particular, if injected current is large enough, then a drain-to-source impedance of PMOS transistor M26 can be decreased to provide an offsetting current which opposes the current injected by parasitic transistor 210. In this way, a gate-to-source voltage of output driver transistor M28 can remain less than its threshold voltage during current injection. Accordingly, when there is sufficient injected current between sense node 258 and substrate, the ESD Trigger output pulse generation is inhibited.

However, in the case of a valid ESD event (an ESD event in which current will be shunted) trigger circuit 200 can operate to generate a pulse signal trig_out that can enable a switched ESD current path. In particular, during an ESD event, in the event a current drawn from sense node 258 to substrate (e.g., via node 206) is large enough to affect a drain-to-source impedance of PMOS transistor M26, the onset of a clamping function for PMOS transistor M26 can be delayed by operation of low pass filter R24/C24. In this way, ESD Trigger behavior of trigger circuit 200 may not be influenced by trigger prevention circuit 204.

Preferably, the time constant of the Low Pass Filter (R24*C24) is much longer than the slew rate detector time constant (R20*C20) and much shorter than the pulse generator time constant (R22*C22). In this case, the low pass filter time constant is 5–10× longer than the slew rate detector time constant, and 50–100× shorter than the pulse generator time constant. Of course, this represents but one particular arrangement. The low pass filter time constant is longer than the slew rate detector so the mirror does not significantly effect detection of ESD events by delaying the mirror activation until after an ESD event has been detected. The low pass filter time constant is shorter than the pulse generator time constant so the mirror will compensate for injected current before the pulse generator activates.

It is understood that a current gain of an injected current mirror (mirror transistor M22 and mirror parasitic device 218) and/or a current gain of filtered current mirror 254 can be adjusted with appropriate scaling of devices M20/M22 and M24/M26. In this manner, a sensitivity of trigger circuit 200 to false trigger behavior induced by injected substrate electrons can be adjusted.

Figure 3:
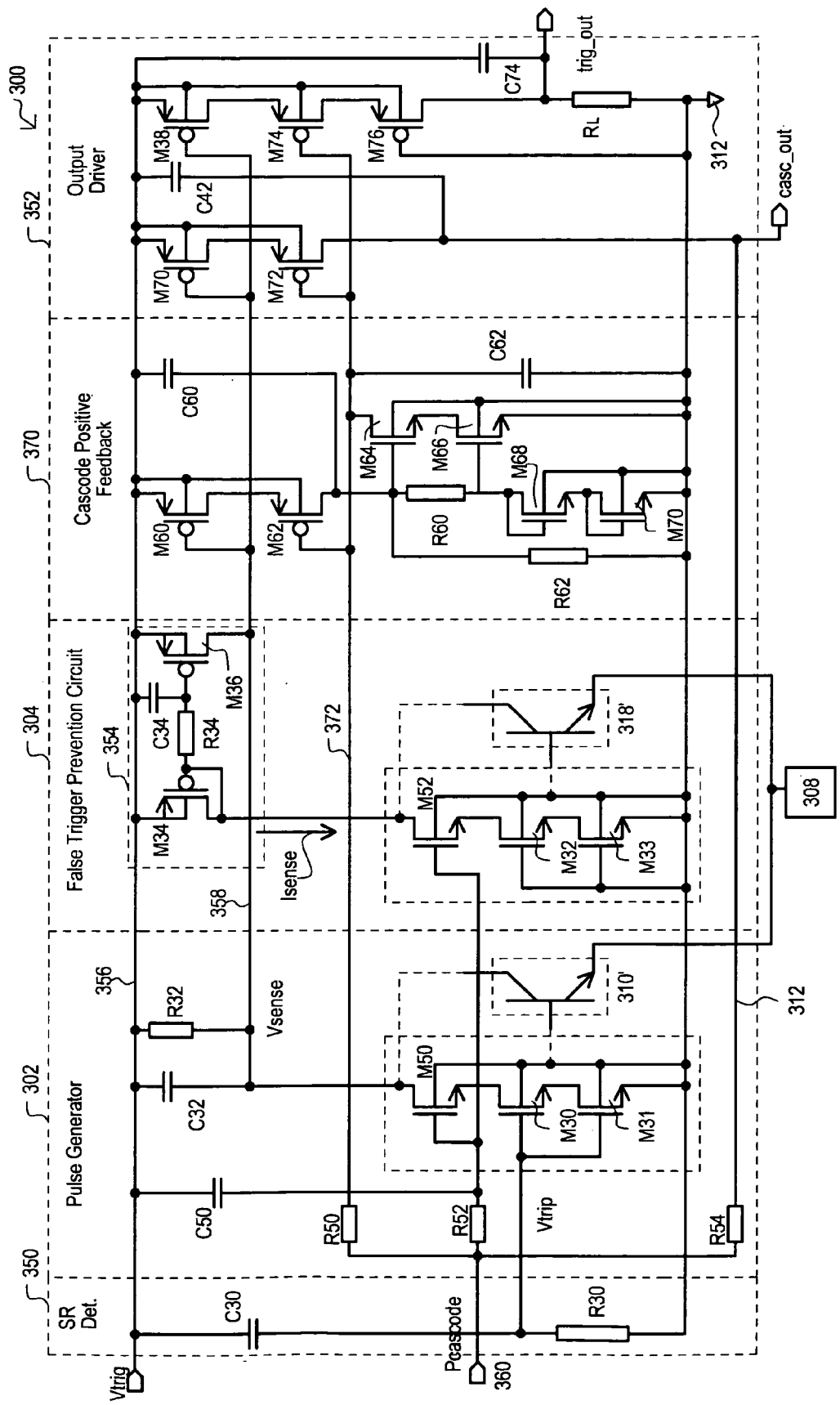
FIG. 3 is a schematic diagram of an ESD trigger circuit according to a third embodiment.

An ESD trigger circuit according to a third embodiment is shown in FIG. 3, and designated by the general reference character 300. An ESD trigger circuit 300 can include some of the same general components and sections as FIG. 2. Accordingly, like items are referred to by the same reference character but with the first digit being a "3" instead of a "2".

The embodiment of FIG. 3 shows a cascoded version of an ESD trigger circuit. Cascodes are cascades or stacks of transistors which can be used to allow higher operating voltages than would not otherwise be possible with single transistors. In the particular example shown, sensing transistors M30 and M31 can be included in a cascaded arrangement with a cascode transistor M50. Cascode transistor M50 can have a source-drain path connected between a drain of transistor M30 and a sense node 358. In such an arrangement, a parasitic device 310' can be formed with respect to cascode stack M30/M31/M50.

A trigger prevention mirror section 304 can have a structure that mirrors (and can be scaled) to the cascode arrangement of transistors M30/M31/M50. Thus, in FIG. 3, mirror transistor M32 can be included in a cascaded arrangement with a cascode mirror transistor M52 and M33. Cascode mirror transistor M52 can have a source-drain path connected between a drain of mirror transistor M32 and filtered current mirror 354. In such an arrangement, a parasitic device 318' can be formed with respect to cascode mirror transistor M52.

Cascode transistor M50 and cascode mirror transistor M52 can have gates commonly connected to a cascode node 360 that can receive a bias potential Pcascode.

In order to ensure adequate injected current mirroring, the same scaling factor applies for transistor pair M50/M52 as for transistor pair M30/M32 and transistor pair M31/M33.

The particular embodiment of FIG. 3 also includes a cascode positive feedback section 370. In an ESD event, cascode positive feedback section 370 can provide a positive feedback effect to enable cascade transistors M50 and M52 in pulse generator 302 and transistor M62 in cascade positive feedback section 370, as well as transistors M72 and M74 in output driver 352. In particular, in an ESD event, a cascade node 372 can be driven low by operation of transistor M64/M66.

In a false trigger event due to injected current, cascade positive feedback section 370 can be prevented from operating as a trigger prevention mirror section 304 can clamp a gate-drain voltage of transistor M60.

An output driver 352 of the embodiment of FIG. 3 can include feedback cascade stack M70/M72 that can drive a feedback signal casc_out high in an ESD event. A pulse signal trig_out can be driven by PMOS transistors M38, M74 and M76. Transistor M38 can have a gate connected to sense node 358, transistor M74 can have a gate connected to cascade node 372, and transistor M76 can have a gate connected to low power supply node 312. It is noted that a pulse signal trig_out can drive a gate of a first current switch transistor. A feedback signal casc_out can drive a gate of another current switch transistor arranged in a cascade fashion with the first current switch transistor.

The rest of the trigger circuit 300 can be implemented in the same general fashion as the trigger circuit 200 shown in FIG. 2.

In this way, in ESD trigger circuit embodiments, an injected current mirror can detect injected substrate current (electrons in this case). In response to such detection, a compensating device can be controlled to offset the effects of current injection and thus disable the generation of a pulse that can enable an ESD current path. At the same time, in an actual ESD event, such a compensating operation can be prevented by a low pass filter (e.g., C34, R34).

Figure 5:
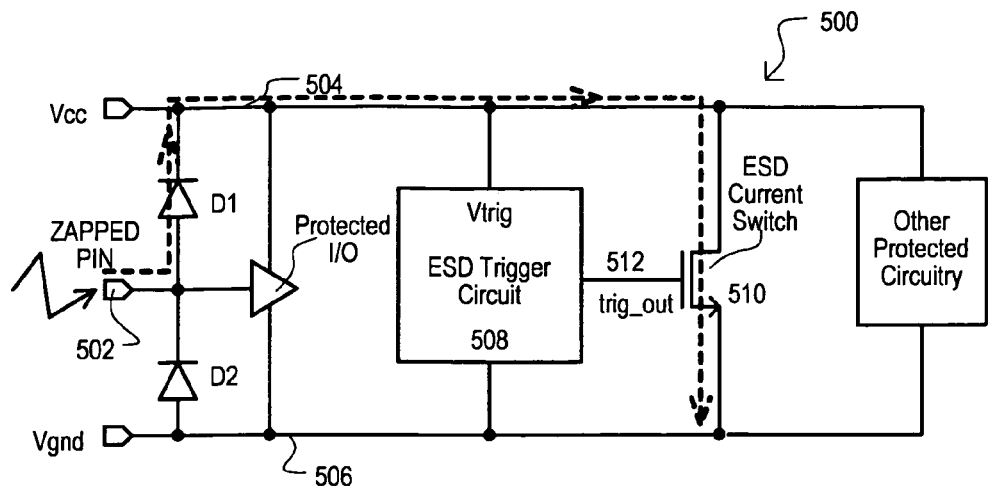
FIG. 5 is a block diagram of a conventional actively switched ESD protection network.

It is understood by those skilled in the art that while a trigger circuit, like that shown in FIGS. 2 and 3 can be used in an actively switched network, like that shown in FIG. 5, such an arrangement is just one realization of many possible configurations. Furthermore, in practice, various ESD protection network alternatives may be selected based on requirements and desired outcomes. Some factors which may affect network decisions include the nature of internal and external power supplies, protection requirements for internal signal isolation, speed, power, and cost, and performance. Most networks can include a plurality of circuits to be protected, including those associated with interface pins among other circuits and devices. To meet these objectives, some implementations can use large lumped active switches, while others can use many smaller devices distributed throughout the integrated circuit. Some can switch between the high voltage and low voltage power supplies, while others may direct the ESD current to an ESD bus which can then be actively switched. Others may power the trigger circuits from an ESD bus. The various embodiment described can apply to any of these approaches and any others which use a circuit to detect and ESD event and activate a switch as described.

Inclusion of trigger circuits according to the above embodiments can provide for greater insensitivity to current injection. As a result, injection sources like semiconductor junctions connected to interface pads may be located in closer physical proximity to ESD trigger circuits. This is shown in FIG. 4.

Figure 4:
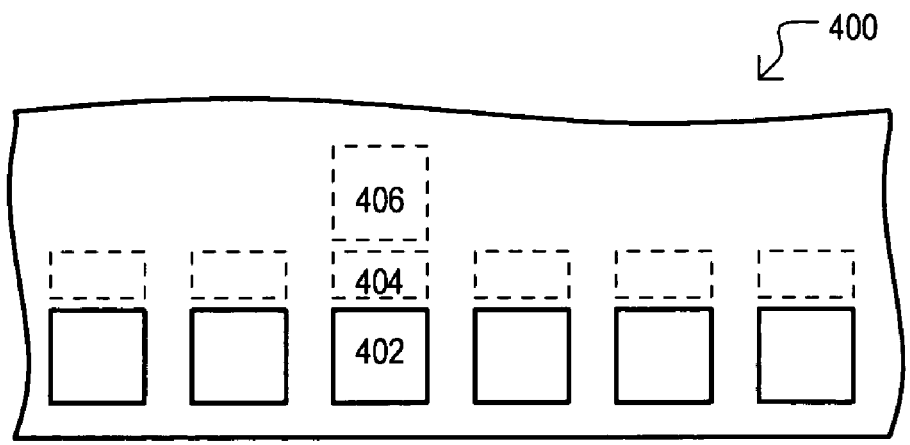
FIG. 4 is a top plan view of an integrated circuit according to an embodiment.
Figure 7:
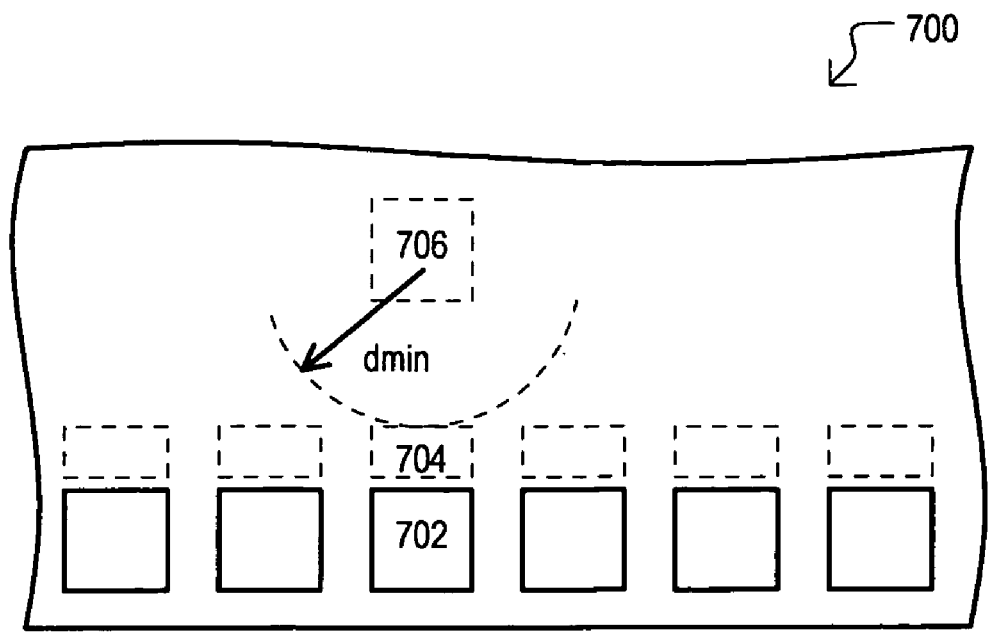
FIG. 7 is a top plan view of a conventional integrated circuit.
Figure 8:
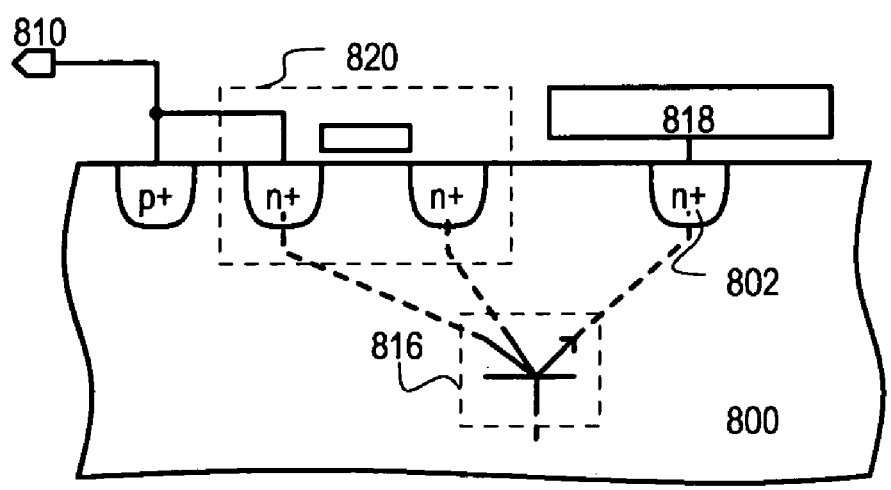
FIG. 8 is a side cross sectional view of a conventional integrated circuit.

FIG. 4 is a top plan view like that of FIG. 7. Shown is a portion of an integrated circuit 400 having a number of pads (one of which is shown as 402) each of which can include an area in which semiconductor junctions which may be forward biased, such as those connected to interface pads (one of which is shown as 404) are formed. A trigger circuit incorporating injection compensation 406 for injecting current can be situated close to areas 404, assuming that trigger circuit 406 is located in close proximity to a substrate diffusion region that receives injected current. The present inventors have demonstrated proximities of 25 μm, where such a distance is constrained by layout considerations unrelated to current injection immunity. It is believed that with appropriate adjustments to device sizes, significantly closer proximities are possible. This is contrast to the arrangement like that of FIG. 7, which imposes some minimum distance (e.g., 200 μm or more) between such structures.

While the above ESD trigger embodiments can provide protection against false trigger events, it is noted that the addition of such circuits can have little if any impact on leakage current at an ESD protection node.

Still further, the inclusion of the above ESD trigger embodiments have little if any impact on the normal operating mode of an integrated circuit.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A circuit, comprising:
a pulse generator circuit that receives a trip input signal activated in response to an interface connection voltage transition exceeding a predetermined rate, the pulse generator circuit including at least a first transistor providing a low impedance path in response to an active trip input signal and a parasitic device formed from a portion of at least the first transistor and an injection diffusion region;
an output driver circuit that enables a switched current path in response to an active trip signal when enabled and does not enable the switched current path when disabled; and
a suppression circuit that includes a mirror transistor having the same general structure as the first transistor and a mirror parasitic device formed from a portion of the mirror transistor and the injection diffusion region, the suppression circuit disabling the output driver circuit in response to an injection current at the injection diffusion region.

2. The circuit of claim 1, wherein:
the first transistor comprises an insulated gate field effect transistor (IGFET) having a drain that provides an output signal and that is coupled to a first impedance and a source coupled to a first power supply node, and
the mirror transistor comprises a mirror IGFET having a source coupled to the first power supply node, the mirror transistor having the same essential channel width-length (W/L) ratio as the first transistor.

3. The circuit of claim 1, wherein:
the first transistor comprises a first n-channel insulated gate field effect transistor (IGFET), and the mirror transistor comprises a mirror n-channel IGFET; and
the parasitic device comprises a parasitic npn bipolar transistor having an emitter coupled to the injection diffusion region, and the mirror parasitic device comprises a mirror npn bipolar transistor having an emitter coupled to the injection diffusion region.

4. The circuit of claim 3, wherein:
the parasitic npn bipolar transistor comprises at least one collector formed by the drain of the first n-channel IGFET, a base formed by a portion of the substrate that includes the channel of the first n-channel IGFET, and an emitter formed by the injection diffusion region; and
the mirror npn bipolar transistor comprises at least one collector formed by the drain of the mirror n-channel IGFET, a base formed by a portion of the substrate that includes the channel of the mirror n-channel IGFET, and an emitter formed by the injection diffusion region.

5. The circuit of claim 1, further including:
a slew rate detector circuit coupled between the interface connection and a power supply node that outputs an active trip signal when the voltage transition at the interface connection exceeds a slew rate established by the slew rate detector.

6. The circuit of claim 1, further including:
at least a second interface connection of the integrated circuit device coupled to the injection diffusion region.

7. The circuit of claim 6, wherein:
the second interface connection of the integrated circuit device is an integrated circuit device pad selected from the group consisting of: an input pad, an output pad, and an input/output (I/O) pad.

8. The circuit of claim 1, wherein:
the output driver circuit comprises an output transistor having a gate coupled to receive the sense signal from the pulse generator circuit; and the suppression circuit further includes a compensating device that provides a low impedance path between the source and gate of the output transistor in response to an injection current at the injection diffusion region.

9. The circuit of claim 1, wherein:
the suppression circuit further includes a low pass filter coupled between the mirror parasitic device and the output driver circuit.

10. A method for compensating for current injection into a substrate of an integrated circuit, comprising the steps of:
activating an electrostatic discharge (ESD) switched current path in response to a predetermined voltage transition rate at an interface connection to the integrated circuit by operation of a first transistor having a source-drain path coupled between a high impedance node and a first power supply node, an effective source-drain impedance of the first transistor being alterable in response to current injection at a substrate region enabling a parasitic transistor;
mirroring changes in the operation of the first transistor with a mirror transistor of the same general construction as the first transistor, an effective source-drain impedance of the mirror transistor being alterable in response to current injection at the substrate region enabling a mirror parasitic transistor; and
preventing the activation of the ESD switched current path in response to current injection induced variation in the effective source-drain impedance of the mirror transistor.

11. The method of claim 10, further including:
activating the ESD switched current path includes generating a trigger pulse by creating a voltage difference between a source and gate of an output driver transistor; and
preventing the activation of the ESD switched current path includes creating a low impedance path between the source and gate of the output driver transistor.

12. The method of claim 10, wherein:
preventing the activation of the ESD switched current path includes
filtering variations in a current drawn by the first transistor with a low pass filter to generate a filtered injection response, and
preventing the activation of the ESD switched current path includes enabling or disabling an output driver transistor in response to the filtered injection response.

13. The method of claim 10, further including:
injecting current into the substrate.

14. A circuit for compensating for current injection in a substrate of an integrated circuit, comprising:
a first active circuit element that provides a controllable impedance path between a first node and a second node and forms part of a parasitic current path that is enabled in response to an injection of current at a current injection node;
a mirror active circuit element formed with the same process steps as the first active circuit element that provides a controllable impedance path between a mirror node and the second node, the mirror active circuit element forming part of a mirror parasitic current path that is enabled in response to the injection of current at the current injection node; and
a detect circuit coupled to the mirror circuit element that outputs an injection effect signal in response to the injection of current at the current injection node.

15. The circuit of claim 14, wherein:
the first active circuit element comprises a first insulated gate field effect transistor (IGFET) and the parasitic a current path comprises at least one parasitic bipolar transistor; and
the mirror active circuit element comprises a mirror IGFET having a same width-to-length ratio as the first IGFET, and the mirror parasitic current path comprises at least one mirror bipolar transistor having an emitter coupled to the emitter of the parasitic bipolar transistor.

16. The circuit of claim 14, further including:
a pulse generator circuit that generates a sense pulse at a sense node with the first active circuit element in response to a trip signal, the trip signal being activated according to a predetermined voltage transition rate at an external connection of the integrated circuit;
an output driver circuit that generates a trigger signal in response to the sense pulse; and
a trigger prevention circuit that disables the output driver circuit in response to the injection effect signal.

17. The circuit of claim 16, wherein:
the first active circuit element comprises an n-channel pulse insulated gate field effect transistor (IGFFET); and
the pulse generator circuit comprises a capacitor and resistor coupled in parallel between the drain of the pulse IGFET and a trigger node, the trigger node being coupled to the external connection of the integrated circuit.

18. The circuit of claim 16, wherein:
the mirror active circuit element comprises an n-channel mirror insulated gate field effect transistor (IGFFET); and
the trigger prevention circuit includes
a first p-channel IGFET having a drain and gate coupled to the drain of the mirror IGFET and a source coupled to a trigger node, the trigger node being coupled to the external connection of the integrated circuit,
a second p-channel IGFET having a drain coupled to the sense node, a gate coupled to the gate of the first p-channel transistor by a low pass filter (LPF) resistor, and a source coupled to the trigger node, and
an LPF capacitor coupled between the gate of the second p-channel IGFET and the trigger node.

19. The circuit of claim 16, further including:
the first active circuit element comprises an n-channel pulse insulated gate field effect transistor (IGFFET); and
a slew rate detector circuit that includes
a detect capacitor coupled between the gate of the pulse IGFET and a trigger node, the trigger node being coupled to the external connection of the integrated circuit, and
a detect resistor coupled between the gate of the pulse IGFET and a power supply node.

20. The circuit of claim 16, wherein:
the first active circuit element comprises an n-channel pulse insulated gate field effect transistor (IGFFET); and
the output driver circuit comprises a p-channel driver IGFET having a drain that provides a trigger signal to an ESD switched current path, a gate coupled to the sense node, and a source coupled to a trigger node, the trigger node being coupled to the external connection of the integrated circuit.

* * * * *